(12) United States Patent
Sonoda et al.

(10) Patent No.: US 10,431,279 B2
(45) Date of Patent: Oct. 1, 2019

(54) MAGNETORESISTIVE MEMORY DEVICE

(71) Applicant: SAMSUNG ELECTRONICS CO., LTD., Suwon-si, Gyeonggi-do (KR)

(72) Inventors: Masatoshi Sonoda, Yokohama (JP); Yoshiaki Sonobe, Yokohama (JP); Takeshi Kato, Nagoya (JP)

(73) Assignee: Samsung Electronics Co., Ltd., Suwon-Si, Gyeonggi-do (KR)

(*) Notice: Subject to any disclaimer, the term of this patent is extended or adjusted under 35 U.S.C. 154(b) by 3 days.

(21) Appl. No.: 15/841,454

(22) Filed: Dec. 14, 2017

(65) Prior Publication Data

US 2018/0226115 A1    Aug. 9, 2018

(30) Foreign Application Priority Data

Feb. 7, 2017    (JP) .................................. 2017-020282

(51) Int. Cl.
| | |
|---|---|
| *G11C 11/00* | (2006.01) |
| *G11C 11/16* | (2006.01) |
| *G11C 7/04* | (2006.01) |
| *H01L 43/10* | (2006.01) |

(52) U.S. Cl.
CPC ............ *G11C 11/1697* (2013.01); *G11C 7/04* (2013.01); *G11C 11/161* (2013.01); *G11C 11/1673* (2013.01); *G11C 11/1675* (2013.01); *G11C 11/1677* (2013.01); *H01L 43/10* (2013.01)

(58) Field of Classification Search
CPC ............................. G11C 11/16; G11C 11/4125

USPC ......................................................... 365/158
See application file for complete search history.

(56) References Cited

U.S. PATENT DOCUMENTS

| | | | |
|---|---|---|---|
| 6,990,015 | B2 | 1/2006 | Honda et al. |
| 7,283,414 | B1 | 10/2007 | So et al. |
| 7,307,302 | B2 | 12/2007 | Saito |
| 7,411,830 | B2 | 8/2008 | Takeuchi et al. |
| 7,755,965 | B2 | 7/2010 | Chen et al. |
| 8,018,787 | B2 | 9/2011 | Oh et al. |
| 8,107,281 | B2 | 1/2012 | Kai et al. |
| 8,724,394 | B2 | 5/2014 | Choe et al. |
| 9,142,277 | B2 | 9/2015 | Kim et al. |
| 9,349,944 | B2 | 5/2016 | Takahashi et al. |
| 2012/0075921 | A1* | 3/2012 | Tanizaki .................. G11C 8/12 365/158 |

(Continued)

FOREIGN PATENT DOCUMENTS

| | | |
|---|---|---|
| JP | 3812498 B2 | 8/2006 |
| JP | 4143020 B2 | 9/2008 |
| JP | 4253225 B2 | 4/2009 |

(Continued)

*Primary Examiner* — Huan Hoang
(74) *Attorney, Agent, or Firm* — Lee & Morse, P.C.

(57) ABSTRACT

A magnetoresistive memory device includes a memory cell including a magnetic tunnel junction element, a detector to detect a current value writable in units of the memory cell, a current value storage area, and a current controller. The current value storage area stores at least one of a maximum value and a minimum value of the writable current value detected by the detector. The current controller performs at least one control operation of an operation of controlling a write current value of the memory cell based on the maximum value and an operation of controlling a read current value of the memory cell based on the minimum value.

10 Claims, 8 Drawing Sheets

(56) References Cited

U.S. PATENT DOCUMENTS

2014/0119107 A1* 5/2014 Cha .................... G11C 11/1673
365/158

FOREIGN PATENT DOCUMENTS

| | | |
|---|---|---|
| JP | 5072120 B2 | 11/2012 |
| JP | 2014-116474 A | 6/2014 |
| JP | 2015-126218 A | 7/2015 |
| JP | 2016-063085 A | 4/2016 |
| JP | 2016-063087 A | 4/2016 |
| JP | 2016-063088 A | 4/2016 |
| JP | 2016-092066 A | 5/2016 |

* cited by examiner

MAGNETORESISTIVE MEMORY DEVICE

CROSS-REFERENCE TO RELATED APPLICATION

Japanese Patent Application No. 2017-020282, filed on Feb. 7, 2017, and entitled, "Magnetoresistive Memory Device," is incorporated by reference herein in its entirety.

BACKGROUND

1. Field

One or more embodiments herein relate to a magnetoresistive memory device.

2. Description of the Related Art

A magnetic tunnel junction (MTJ) element may be used to form a memory cell. A read operation for an MTJ element is performed by a magnetic resistance effect with perpendicular magnetization. One type of MTJ element includes a magnetic tunnel junction layer having an insulating layer between a free layer and a reference layer. The magnetization direction of the free layer is variable, while the reference layer maintains a predetermined magnetization direction.

In a memory using the MTJ element, a switching current (minimum write current) may decrease at high temperatures. For example, the write current may decrease by about 10% at 75° C. As a result, an unselected memory cell may be disturbed if the write current at room temperature (e.g., 25° C.) is used at high temperature without modification.

Since the current driving capability of a write current source circuit itself decreases as a temperature increases, the write current may decreases to some extent. However, the write current may not decrease as much as the switching current decreases. The switching current due to high temperature markedly decreases according to miniaturization of a memory cell, thereby causing a significant decrease in write margin.

Also, read margin may decrease due to high temperature in a read operation, e.g., an MTJ element may have voltage dependency and temperature dependency. Accordingly, since a magnetoresistive (MR) ratio and a current difference also have temperature dependency, the read margin may decrease as temperature increases.

In a magnetoresistive random access memory (MRAM) device, since a read current is a tunnel current between magnetic materials, an increase in a temperature causes both a decrease in magnetization of a magnetic film and an increase in a tunnel probability due to thermal excitement. Since the tunnel current increases and the MR ratio sharply decreases, read margin decreases. The decrease in read margin significantly depends on temperature due to miniaturization of a memory cell.

SUMMARY

In accordance with one or more embodiments, a magnetoresistive memory device includes a memory cell including a magnetic tunnel junction element; a detector to detect a current value writable in units of the memory cell; a current value storage area to store at least one of a maximum value and a minimum value of the writable current value detected by the detector; and a current controller to perform at least one control operation of an operation of controlling a write current value of the memory cell based on the maximum value and an operation of controlling a read current value of the memory cell based on the minimum value.

In accordance with one or more other embodiments, an apparatus includes an interface; and a controller to output at least one signal through the interface to perform at least one of a first operation and a second operation, wherein the first operation corresponds to controlling a write current value of a memory cell based on a maximum value and the second operation corresponds to controlling a read current value of the memory cell based on a minimum value, wherein the memory cell includes a magnetic tunnel junction element of a magnetoresistive memory device, and the maximum value and the minimum value are based on a current value writable in units of the memory cell.

In accordance with one or more other embodiments, an apparatus includes an interface and a controller to send at least one signal through the interface, wherein the at least one signal is to control a write current value of a memory cell based on a first value or a read current value of the memory cell based on a second value, wherein the first and second values correspond to a writable current value of the memory cell and wherein the memory cell includes a magnetic tunnel junction element. The first value may be a maximum value of the writable current value, and the second value may be a minimum value of the writable current value. The maximum value and the minimum value may correspond to a temperature of a magnetoresistive memory device including the memory cell.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
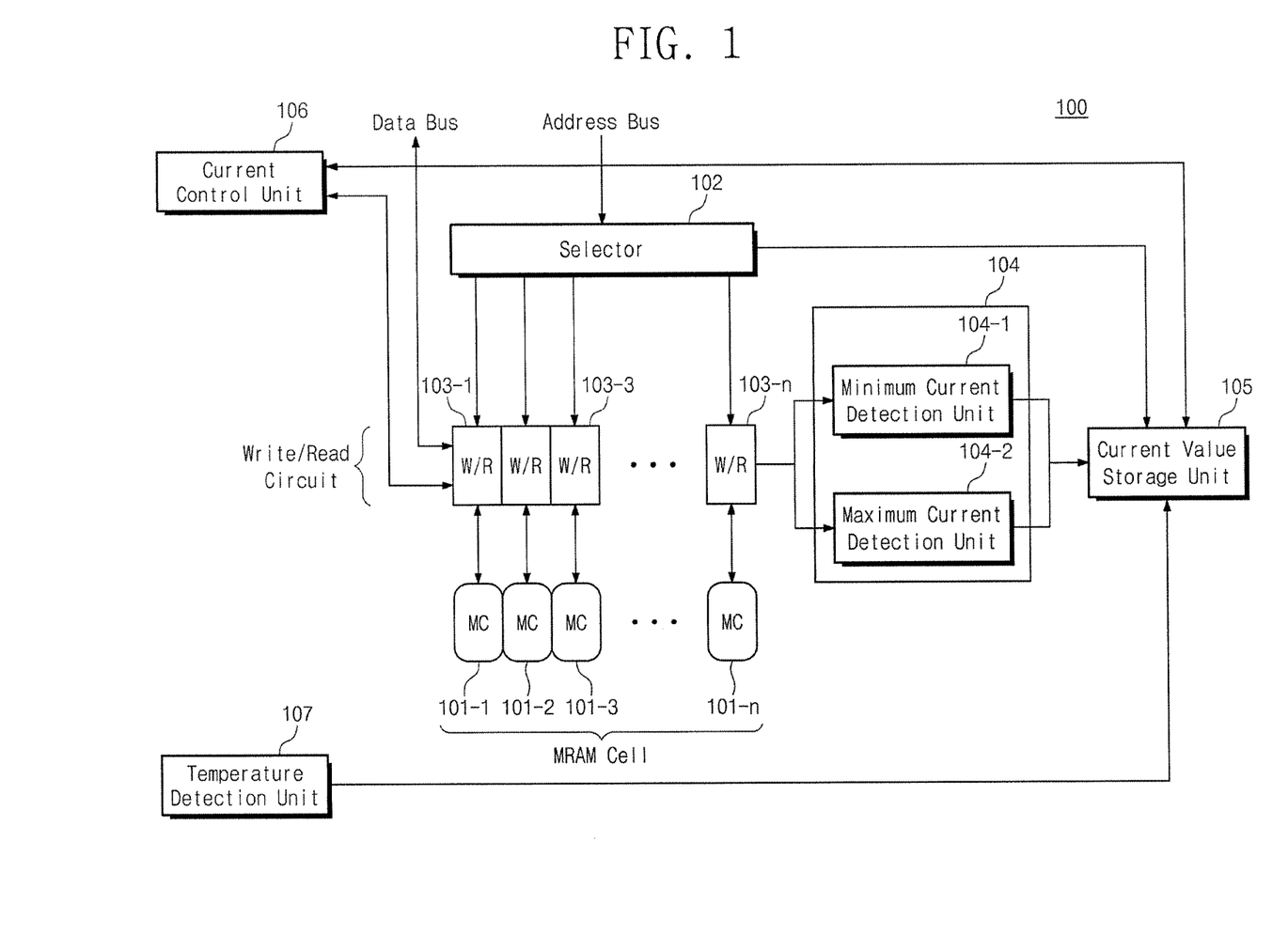
FIG. 1 illustrates an embodiment of a magnetoresistive memory device.

FIG. 1 illustrates an embodiment of a magnetoresistive memory device 100 which includes memory cells (MCs) 101-1 to 101-n, a selector 102, write/read circuits (W/R) 103-1 to 103-n, a current detection unit 104, a current value storage unit 105, a current control unit (or controller) 106, and a temperature detection unit 107. The detection units described herein may otherwise be referred to as detectors. The current value storage unit described herein may otherwise be referred to as a current value storage area.

Each of the memory cells 101-1 to 101-n stores and retains information of one or more bits each corresponding to "0" or "1" of a minimum unit of information. When a selection signal from the selector 102 is valid, respective ones of the memory cells 101-1 to 101-n store information or output stored information. The memory cells 101-1 to 101-n may be, for example, MRAM cells.

The selector 102 outputs selection signals to the write/read circuits 103-1 to 103-n for selecting the memory cells 101-1 to 101-n to be read from or written to. For example, in the case of a random access, the selector 102 outputs selection signals to the write/read circuits 103-1 to 103-n respectively corresponding to the memory cells 101-1 to 101-n. Also, in a test mode for detecting a maximum value and/or a minimum value of a write current of the memory cells 101-1 to 101-n, the selector 102 outputs a selection signal to the write/read circuits 103-1 to 103-n in order.

It may be possible to write information in the corresponding memory cells 101-1 to 101-n, or to read information from the corresponding memory cells 101-1 to 101-n, based on the selection signals from the selector 102. During writing of the write/read circuit, it may be possible to output a current flowing to the memory cells 101-1 to 101-n to the current detection unit 104.

The current detection unit 104 detects the value of current flowing to the memory cells 101-1 to 101-n during writing. The current detection unit 104 outputs a maximum value and/or a minimum value of the current value to the current value storage unit 105.

The current value storage unit 105 stores a maximum value and/or a minimum value of a current flowing to the memory cells 101-1 to 101-n. For example, in the test mode, the current value storage unit 105 stores a temperature of the memory cells 101-1 to 101-n and a maximum value and/or a minimum value of a current of the memory cells 101-1 to 101-n. The current value storage unit 105 outputs, to the current control unit 106, a maximum value and/or a minimum value of a current value corresponding to a temperature from the temperature detection unit 107.

A storage area for storing the maximum current value and/or the minimum current value may be implemented with elements different from the MRAM cells. In one embodiment, the maximum current value and/or the minimum current value may be stored in an MRAM cell array, in the form of the majority vote or in a high reliability form including an error correction code.

The current control unit 106 controls a write current value of the memory cells 101-1 to 101-n based on the maximum current value from the current value storage unit 105. For example, the current control unit 106 controls the write current value of the memory cells 101-1 to 101-n to be the maximum current value or more.

Also, the current control unit 106 controls a read current value of the memory cells 101-1 to 101-n based on the minimum current value from the current value storage unit 105. For example, the current control unit 106 controls the read current value of the memory cells 101-1 to 101-n to be the minimum current value or more.

Also, in the test mode, the current control unit 106 varies a value of a write current flowing to the memory cells 101-1 to 101-n continuously (or stepwise). The current detection unit 104 may detect the maximum current value and/or the minimum current value by varying the current value. The current value storage unit 105 may store the maximum current value and/or the minimum current value thus detected.

The temperature detection unit 107 detects a temperature of the magnetoresistive memory device 100 and converts the detected temperature to an electrical signal. The current detection unit 104 outputs the electrical signal indicating the temperature to the current value storage unit 105. For example, the temperature detection unit 107 may include a temperature sensor that converts a detected temperature to an electrical signal, an amplifier that amplifies the electrical signal, and an analog-to-digital (AD) converter that converts the electrical signal from an analog signal to a digital signal.

Through the above-described configuration, the magnetoresistive memory device 100 controls a write current value and a read current value. An embodiment of how the magnetoresistive memory device 100 controls a write current value and a read current value will be described below.

First, there will be described an operation (test mode) that uses a maximum value and a minimum value of a write current value of the memory cells 101-1 to 101-n. The memory cells 101-1 to 101-n may have a write current value and a read current value depending on a distribution of respective element. The write/read circuit 103-1 detects a minimum write current value for writing information in the memory cells 101-1 to 101-n in units of a memory cell. The current detection unit 104 detects a maximum value and a minimum value of a write current value of each of the memory cells 101-1 to 101-n.

For example, the current control unit 106 set the write/read circuit 103-1 with a write current of a predetermined minimum current value. The write/read circuit 103-1 outputs the write current of the predetermined minimum current value such that information is written in the memory cell 101-1. Afterwards, the write/read circuit 103-1 reads information from the memory cell 101-1.

When information written in the memory cell 101-1 coincides with information read from the memory cell 101-1, the write/read circuit 103-1 determines that the writing operation is successful and outputs a write current value to the current detection unit 104. Also, the write/read circuit 103-1 outputs the write pass result to the selector 102 and the current control unit 106.

When information written in the memory cell 101-1 does not coincide with information read from the memory cell 101-1, the write/read circuit 103-1 determines that writing fails and outputs the write fail result to the current detection unit 106.

When the current control unit 106 receives the write fail result, the current control unit 106 outputs an instruction to increase a write current value to the write/read circuit 103-1. An increment (an increasing strength) of the write current value may have a value that is set in advance.

The write/read circuit 103-1 writes information in the memory cell 101-1, depending on the instruction, to increase the write current value. Afterwards, the write/read circuit 103-1 reads information from the memory cell 101-1. As described above, the write/read circuit 103-1 determines whether information written in the memory cell 101-1 and information read from the memory cell 101-1 coincide with each other.

Operations performed when information written in the memory cell 101-1 and information read from the memory cell 101-1 coincide with each other may be the same as described above. Also, operations performed when information written in the memory cell 101-1 and information read from the memory cell 101-1 do not coincide with each other may be the same as described above.

The above-described operation is repeated until information written in the memory cell 101-1 and information read from the memory cell 101-1 coincide with each other.

If the selector 102 receives the write pass result, the selector 102 changes a write and read target from the memory cell 101-1 to the memory cell 101-2. Also, if the current control unit 106 receives the write pass result, the current control unit 106 set the write/read circuit 103-2 with a write current of a predetermined minimum current value.

Like the above-described operation associated with the memory cell 101-1, the current control unit 106 stepwise increases a write current value until information written in the memory cell 101-2 and information read from the memory cell 101-2 coincide with each other. In the case where information written in the memory cell 101-2 coincides with information read from the memory cell 101-2, the write/read circuit 103-2 determines that writing is successful and outputs a write current value to the current detection unit 104.

Likewise, with regard to a write current value of the memory cells 101-3 to 101-n, the write/read circuit 103-1 detects a minimum write current value for writing information in the memory cells 101-3 to 101-n in units of a memory cell.

As such, the current control unit 106 and the write/read circuits 103-1 to 103-n detect a write current value of the memory cells 101-1 to 101-n in units of a memory cell.

Figure 2:
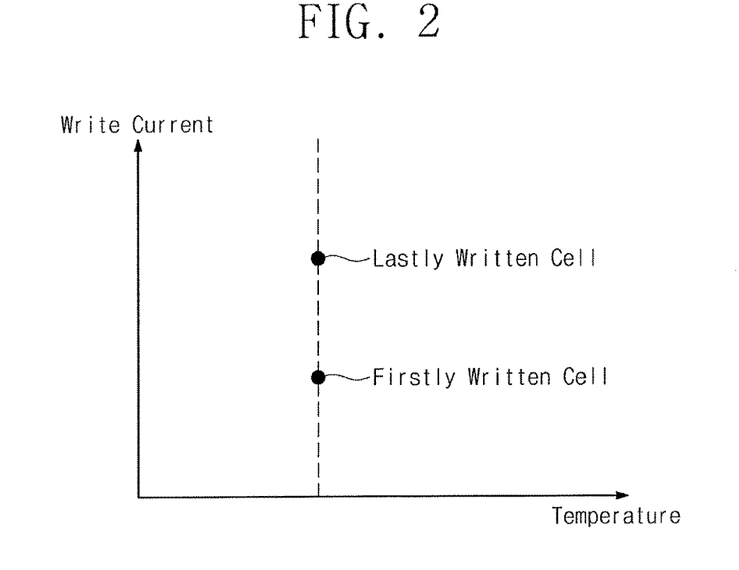
FIG. 2 illustrates an example of a relationship between temperature and maximum and minimum values of a write current value in a test mode.

FIG. 2 is a graph illustrating an example of a relationship between temperature and a maximum value and a minimum value of a write current value in a test mode. In FIG. 2, the vertical axis represents a write current value and the horizontal axis represents a temperature of a memory cell.

Like the above-described test mode, when a determination is made that a writing operation performed using a predetermined minimum current value is successful, and a write current value increases until the writing is successful, as illustrated in FIG. 2, a write current value of a firstly write-passed cell is a minimum value of a write current value. As illustrated in FIG. 2, a write current value of a lastly write-passed cell may be a maximum value of the write current value. Also, as illustrated in FIG. 2, the current value storage unit 105 stores a record characteristic distribution of cells at one temperature.

Figure 3:
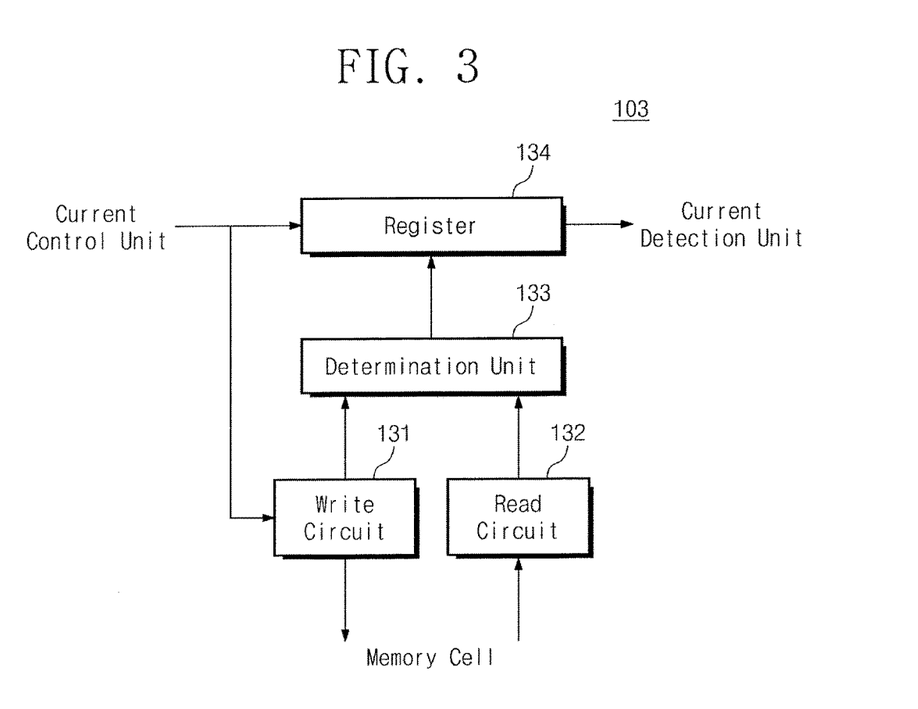
FIG. 3 illustrates an embodiment of a write/read circuit.

FIG. 3 illustrates an embodiment of a write/read circuit of a magnetoresistive memory device. In FIG. 3, the write/read circuit 103 includes a write circuit 131, a read circuit 132, a determination unit 133, and a register 134.

The write circuit 131 is provided with write information from an external source through a data bus. When a memory cell 101 is selected by the selector 102, the write circuit 131 writes information in the memory cell 101 using a write current instructed from the current control unit 106. Also, the write circuit 131 outputs the information to be written to the determination unit 133.

When the memory cell 101 is selected by the selector 102, the read circuit 132 reads information from the memory cell 101. The read circuit 132 outputs the read information to the determination unit 133, and the read circuit 132 outputs the read information to the external source (or other outside device) through the data bus.

The determination unit 133 determines whether information output from the write circuit 131 is the same as information output from the read circuit 132. When the information output from the write circuit 131 is the same as the information output from the read circuit 132, the determination unit 133 requests the register 134 to output a write current value stored therein.

The register 134 stores a write current instructed from the current control unit 106. When a new write current value is provided from the current control unit 106, the register 134 stores the newly provided write current value. The register 134 outputs a stored write current value to the current detection unit 104 based on an instruction from the determination unit 133.

With the above-described configuration, the write/read circuits 103-1 to 103-n detect a minimum write current value for writing information in units of a memory cell.

Referring again to FIG. 1, the current detection unit 104 includes a minimum current detection unit 104-1 and a maximum current detection unit 104-2. The minimum current detection unit 104-1 detects a minimum value of a write current of the memory cells 101-1 to 101-n. The maximum current detection unit 104-2 detects a maximum value of the write current of the memory cells 101-1 to 101-n.

Figure 4:
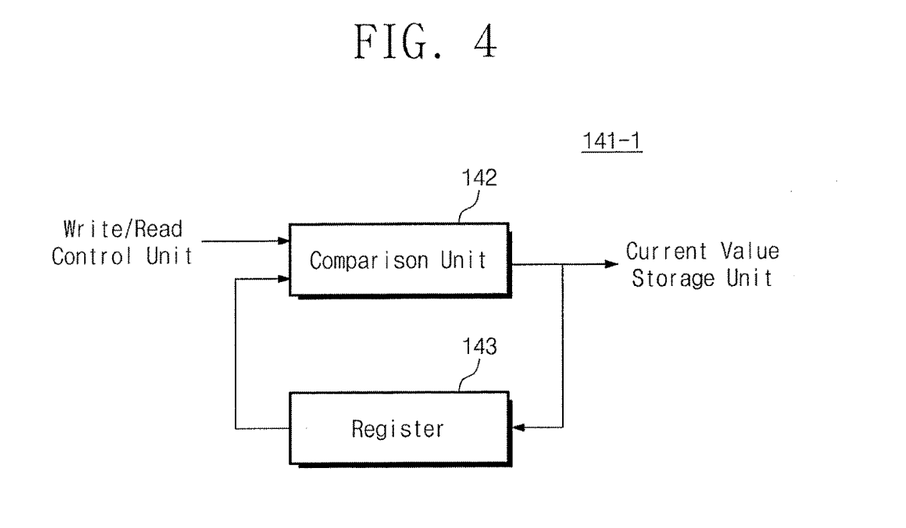
FIG. 4 illustrates an embodiment of a minimum current detection unit.

FIG. 4 illustrates an embodiment of a minimum current detection unit of a magnetoresistive memory device, for example, as described herein. In FIG. 4, the minimum current detection unit 104-1 includes a comparator 142 and a register 143. The comparator 142 compares a write current value stored in the register 143 and a write current value output from each of the write/read circuits 103-1 to 103-n. The comparator 142 outputs a write current value, which may be relatively small, to the register 143 and the current value storage unit 105 as the comparison result. The register 143 stores a write current value output from the comparator 142. With this configuration, the minimum current detection unit 104-1 detects a minimum value of a write current of the memory cells 101-1 to 101-n.

Figure 5:
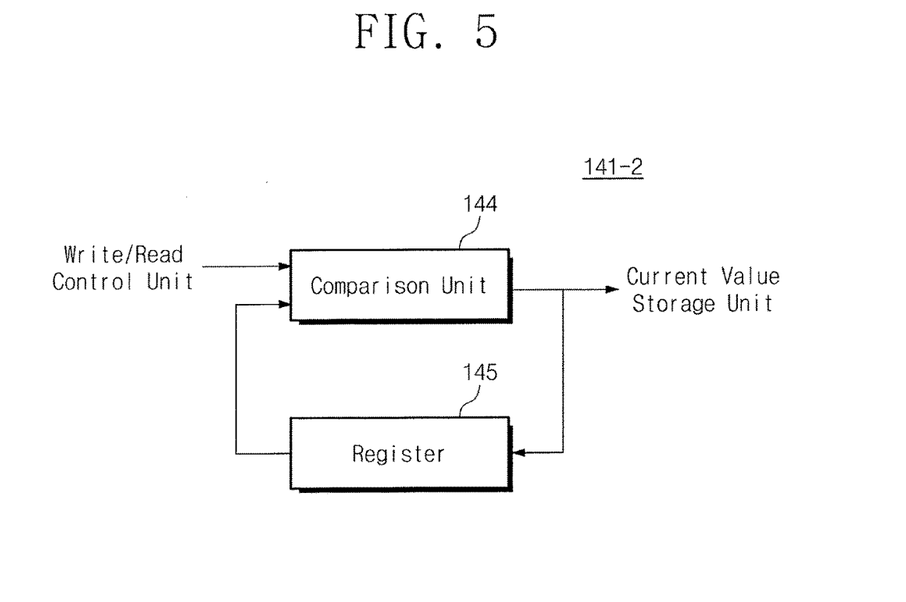
FIG. 5 illustrates an embodiment of a maximum current detection unit.

FIG. 5 illustrates an embodiment of a maximum current detection unit of a magnetoresistive memory device, for example, as described herein. In FIG. 5, the maximum current detection unit 104-2 includes a comparator 144 and a register 145. The comparator 144 compares a write current value stored in the register 145 and a write current value output from each of the write/read circuits 103-1 to 103-n. The comparator 144 outputs a write current value, which may be relatively large, to the register 145 and the current value storage unit 105 as the comparison result. The register 145 stores a write current value output from the comparator 144. With this configuration, the maximum current detection unit 104-2 detects a maximum value of a write current of the memory cells 101-1 to 101-n.

As such, with the magnetoresistive memory device as described, a write fail and/or an abnormal write operation may be reduced, even when the temperature of a memory cell varies. This may be accomplished by detecting a current value writable in units of a memory cell, storing at least one of a minimum value and a maximum value of a writable current value, and performing at least one of an operation of controlling a write current value of a memory cell based on the maximum value and an operation of controlling a read current value of a memory cell based on the minimum value.

A minimum value and a maximum value of the write current value may vary with a temperature of a cell.

Figure 6:
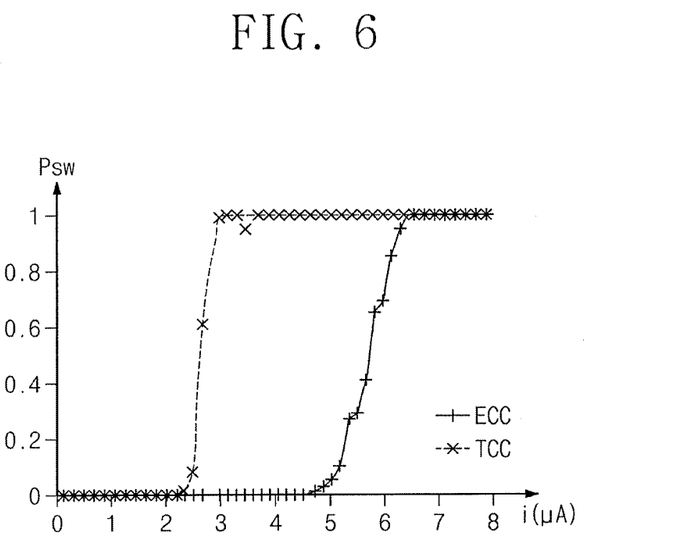
FIG. 6 illustrates an example of a relationship between a magnetization switching probability and a current value in a memory using a magnetic tunnel junction element.
Figure 7:
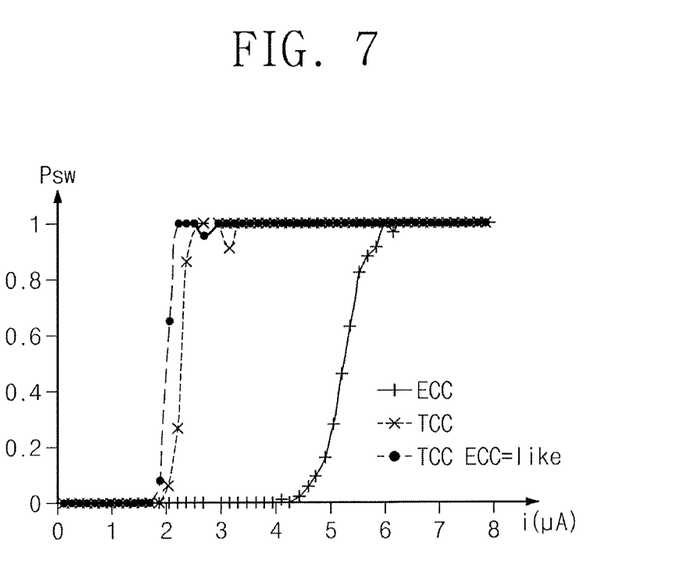
FIG. 7 illustrates an example of a relationship between a magnetization switching probability and a current value in a memory using a magnetic tunnel junction element.
Figure 8:
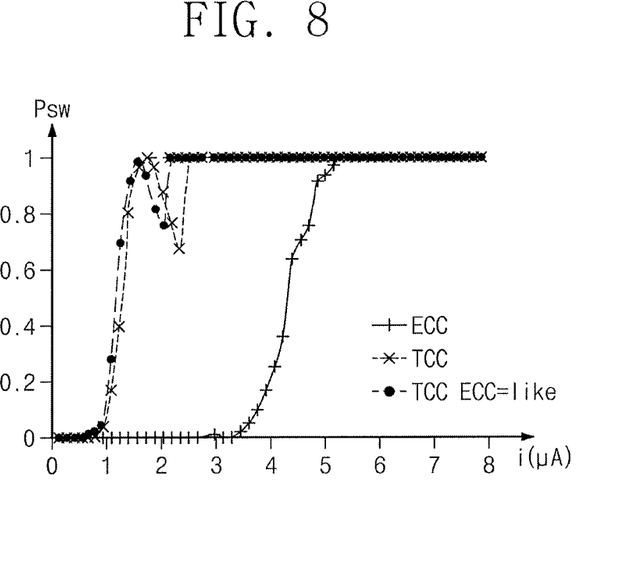
FIG. 8 illustrates an example of a relationship between a magnetization switching probability and a current value in a memory using a magnetic tunnel junction element.

FIGS. 6 to 8 illustrate examples of relationships between a magnetization switching probability and a current value in a memory using a magnetic tunnel junction element. In FIGS. 6 to 8, the horizontal axis represents a write current (write current value) and the vertical axis represents a magnetization switching probability of a storage slot of a memory. Also, in FIGS. 6 to 8, an exchange coupled composite (ECC), a TC controlled (TCC: Curie temperature control), and a TOC ECC-like indicate a structure of a memory using a magnetic tunnel junction element.

In particular, FIG. 6 illustrates an example of a relationship between a magnetization switching probability and a current value at 273K (0° C.). FIG. 7 illustrates an example of a relationship between a magnetization switching probability and a current value at 300K (27° C.). FIG. 8 illustrates an example of a relationship between a magnetization switching probability and a current value at 353K (80° C.). In FIGS. 6 to 8, write current increases at a low temperature. This relates to improvement in thermal stability of a composite membrane. In contrast, write current decreases at a high temperature.

Since a write current value and a read current value of a memory cell depends on temperature, the magnetoresistive memory device 100 controls a maximum value and/or a minimum value of a write current value based on a temperature of a memory cell. For example, the current detection unit 104 detects a maximum value and a minimum value of a write current value for each temperature by performing operations of the above-described test mode for each temperature.

With regard to a write operation, the current value storage unit 105 stores a temperature of the memory cells 101-1 to 101-n and a maximum value and/or a minimum value of a current of the memory cells 101-1 to 101-n to correspond to each other. Afterwards, the current value storage unit 105 outputs, to the current control unit 106, a maximum value and/or a minimum value of a current value corresponding to a temperature from the temperature detection unit 107.

The current control unit 106 controls a write current value of the memory cells 101-1 to 101-n based on the maximum current value from the current value storage unit 105. Also, the current control unit 106 controls a read current value of the memory cells 101-1 to 101-n based on the minimum current value from the current value storage unit 105.

Figure 9:
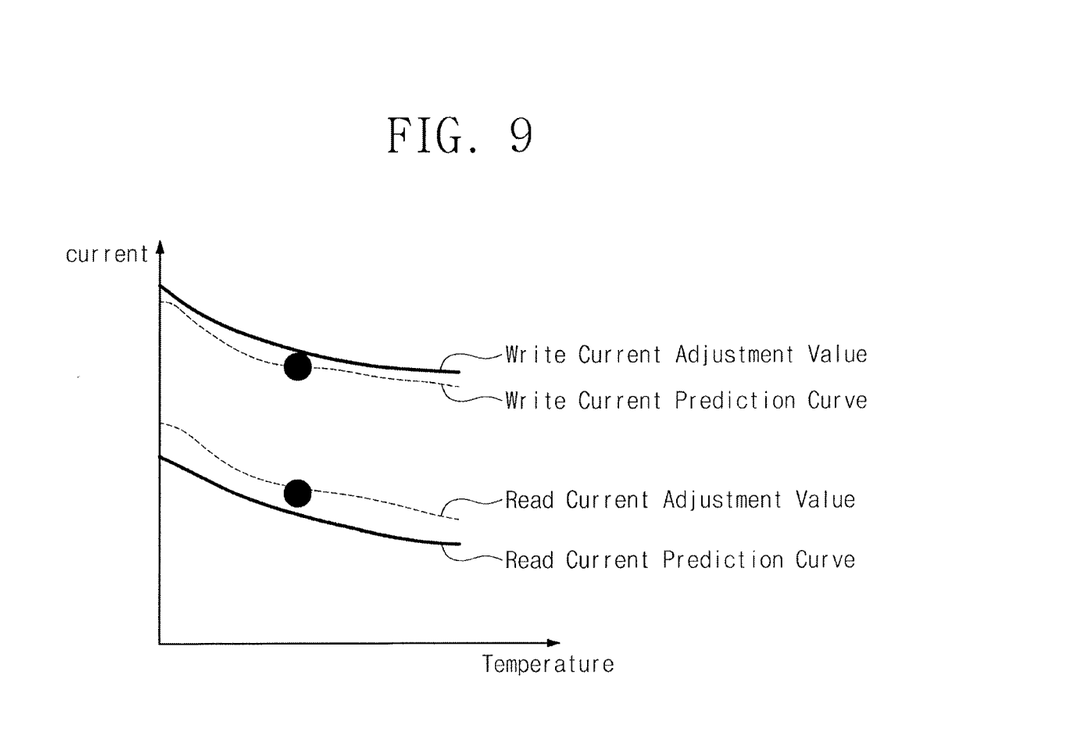
FIG. 9 illustrates an example of a relationship between a temperature and a maximum value and a minimum value of a write current value.

FIG. 9 is a graph illustrating an example of a relationship between a temperature and a maximum value and a minimum value of a write current value. In FIG. 9, the vertical axis represents a write current value and the horizontal axis represents a temperature of a memory cell.

In FIG. 9, a write current prediction curve is derived from a relationship between a temperature and a maximum value of a write current value stored in the current value storage unit 105. A write current adjustment value is controlled by the current control unit 106.

As in the above description, a read current prediction curve is a curve derived from a relationship between a temperature and a minimum value of a write current value stored in the current value storage unit 105. A read current adjustment value is controlled by the current control unit 106.

It may be possible to use an equation obtained by modeling temperature dependency or to store and retain a lookup table based on temperature dependency modeled in advance.

Thus, in accordance with a magnetoresistive memory device of one or more embodiments, a write fail and/or an abnormal write operation may be reduced, even when a temperature of a memory cell varies. This may be accomplished by storing a correspondence relationship between at least one of a minimum value and a maximum value of a write current value and a temperature measured by a temperature sensor, and performing at least one of an operation of controlling a write current value of a memory cell based on the maximum value corresponding to a temperature at writing and an operation of controlling a read current value of a memory cell based on the minimum value corresponding to the minimum value corresponding to a temperature at writing.

Other embodiments involve, for example, storing an address of a memory cell, at which at least one of a maximum value and a minimum value of a write current value is detected, and updating a record of at least one of the maximum value and the minimum value of the write current value based on the write current value of the memory cell of the address.

Figure 10:
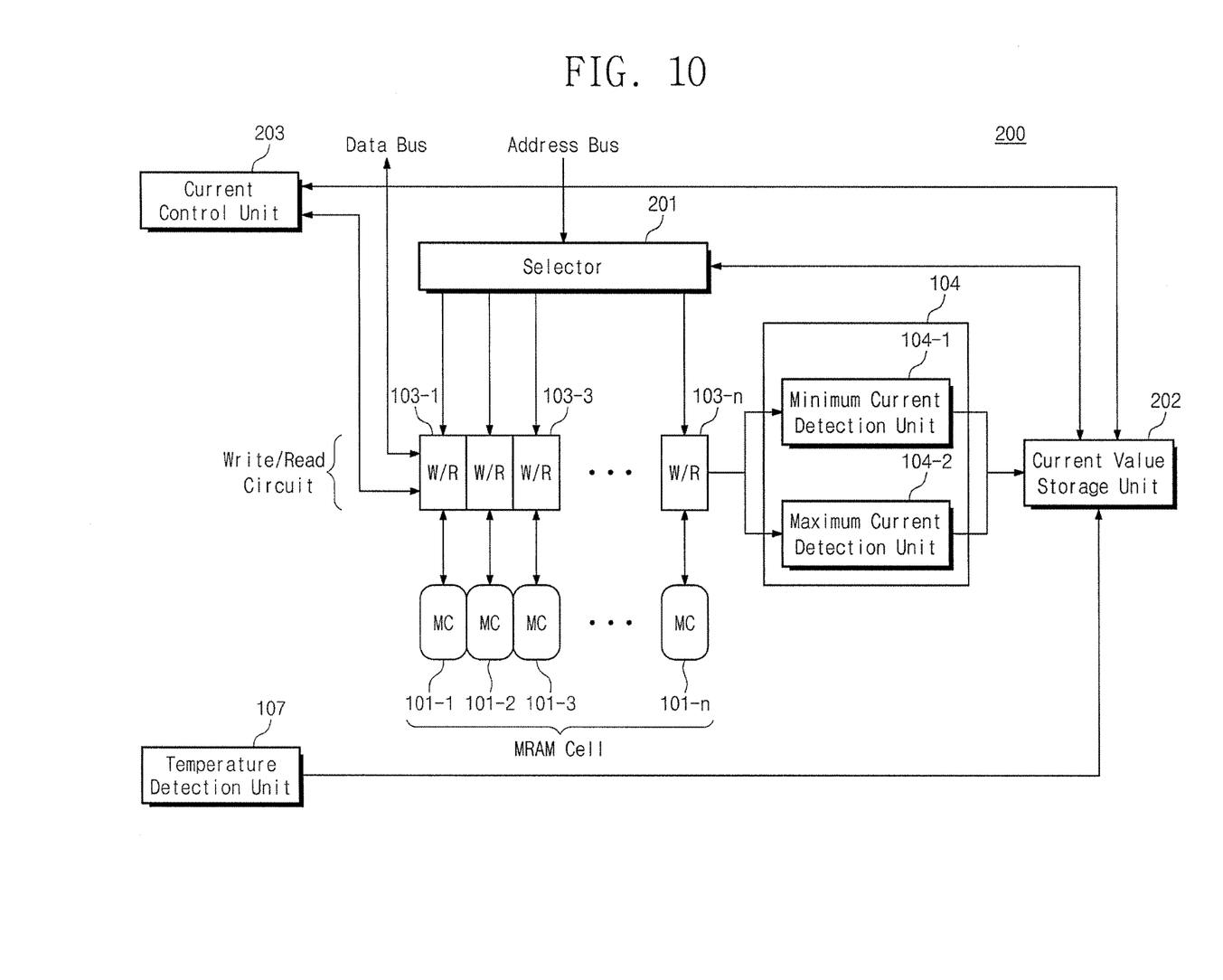
FIG. 10 illustrates another embodiment of a magnetoresistive memory device.

FIG. 10 illustrates, for example, another embodiment of a magnetoresistive memory device 200 which includes the memory cells 101-1 to 101-n, a selector 201, the write/read circuit 103, the current detection unit 104, a current value storage unit 202, a current control unit 203, and the temperature detection unit 107. In addition to the function of the selector 102, the selector 201 outputs an address of a memory cell, at which at least one of a maximum value and a minimum value is detected, to the current value storage unit 202.

In addition to the function of the current value storage unit 105, the current value storage unit 202 stores an address of a memory cell, at which at least one of a maximum value and a minimum value of a write current is detected. For example, the current value storage unit 202 stores an address of a memory cell output from the selector 201 at timing when a maximum value of a write current is output from the current detection unit 104. The current value storage unit 202 stores an address of a memory cell output from the selector 201 at timing when a minimum value of a write current is output from the current detection unit 104.

In addition to the function of the current control unit 106, the current control unit 203 executes the test mode (e.g., as described above) with respect to a memory cell of an address stored in the current value storage unit 202 at any or a predetermined timing.

With this configuration, the magnetoresistive memory device 200 may update at least one of a maximum value and a minimum value of a write current at any timing or a predetermined timing. For example, the probability that characteristic fluctuations due to deterioration are problematic may be considered in an actual product. According to the present embodiment, the magnetoresistive memory device 200 may cope with deterioration.

For example, the same test may be performed as a mass-production test after the product is used in the market, for example, periodically (e.g., one month). The present embodiment may be different from the previous embodiment, for example, in that only fluctuations of current values of "specific addresses" are tested using information of the "specific addresses" of the lastly written cell (e.g., a cell having a maximum write current value) and a firstly written cell (e.g., a cell having a minimum write current value), which provides a limited current during a mass-production test.

In one embodiment, only a stored value of a limited current may be updated according to deterioration without interrupting an operation, which is requested by a user, for a long (or at least a predetermined) time while operating in the market. For example, almost the same operation as write current detection may be performed during a mass-production test. However, since a detection target includes only two addresses of the firstly written cell and the lastly written cell, a current value and an operation temperature at that time may be updated and stored as a new limited current.

In addition, in the present embodiment, since reading or writing not requested by the user is sporadically performed during an operation, read and write performance may deteriorate somewhat. However, an improvement in reliability may be realized for a long (or at least a predetermined) time through exchange. For example, in one embodiment, it may be optimal to replace eFLASH for retaining data for a long time stably.

According to the magnetoresistive memory device of the present embodiment, a write fail and/or an abnormal write operation may be reduced even when a characteristic varies due to deterioration. This may be accomplished by storing an address of a memory cell, at which at least one of a maximum value and a minimum value of a write current value is detected, and updating a record of at least one of the maximum value and the minimum value of the write current value based on the write current value of the memory cell of the address.

Figure 11:
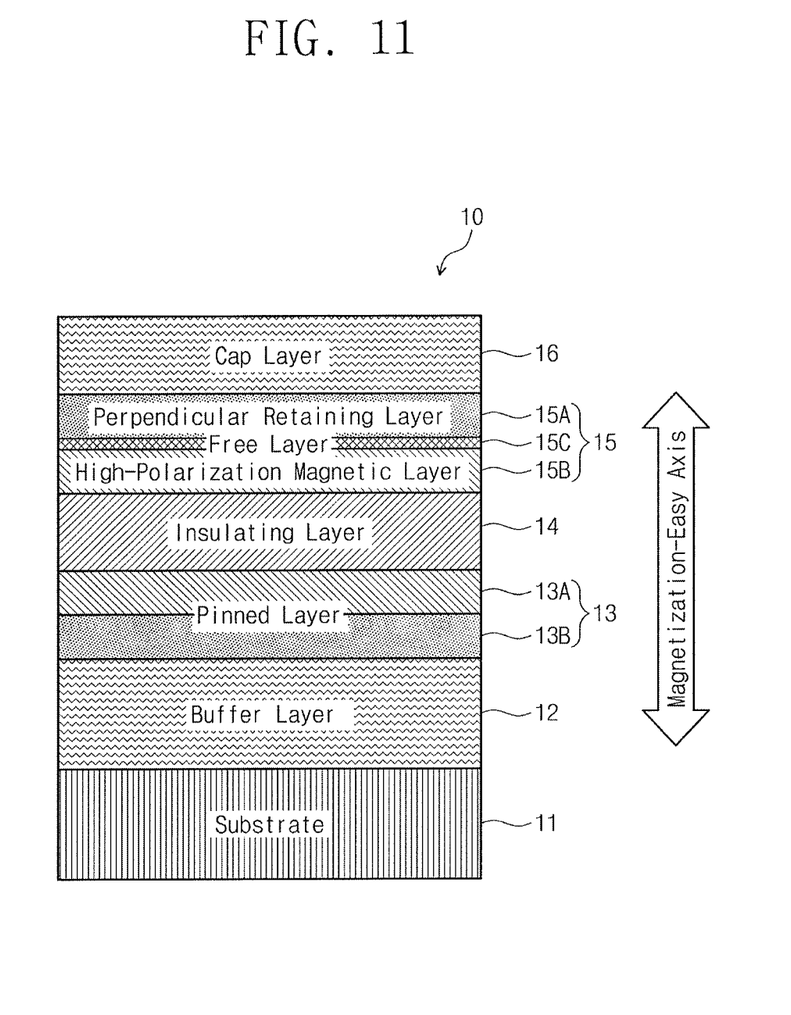
FIG. 11 illustrates an embodiment of a magnetic tunnel junction element.

FIG. 11 illustrates a sectional view of an embodiment of a magnetic tunnel junction element. In FIG. 11, a magnetic tunnel junction element 10 includes a substrate 11, a buffer layer 12, a pinned layer 13, an insulating layer 14, a free layer 15, and a cap layer 16. The substrate 11 may be, for example, a silicon (Si) substrate or Si monocrystalline substrate including a thermal oxide film. The buffer layer 12 serves as a stabilization layer on the substrate 11 and may include Cr, Ta, Au, W, Pt, Ti, or another material.

The pinned layer 13 includes a layer 13A using a Heusler alloy film as a main component and a Co/Pt multi-layered film 13B. The layer 13A that uses the Heusler alloy film as a main component may be a layer that uses Co-based full-Heusler alloy as a main component. For example, the Co-based full-Heusler alloy may be $Co_2FeSi$, $Co_2MnSi$, $Co_2FeMnSi$, $Co_2FeAl$, or $Co_2CrAl$. Also, the Co/Pt multi-layered film 13B may have great (e.g., a predetermined) perpendicular magnetic anisotrophy. As illustrated in FIG. 11, the layer 13A that uses the Heusler alloy film as a main component makes contact with the insulating layer 14. The Co/Pt multi-layered film 13B makes contact with the buffer layer 12. The pinned layer 13 is called a "reference layer".

The insulating layer 14 may include an insulating material as a main component. The insulating layer 14 is between the pinned layer 13 having ferromagnetism and the free layer 15. Since a voltage is applied to be perpendicular to an interface between the pinned layer 13 and the free layer 15, a current flows to the magnetic tunnel junction element 10 by the tunneling effect.

The free layer 15 includes a perpendicular retaining layer 15A, a high-polarization magnetic layer 15B, and a non-magnetic layer 15C. As illustrated in FIG. 11, the layers are stacked in order of the high-polarization magnetic layer 15B, the non-magnetic layer 15C, and the perpendicular retaining layer 15A from the insulating layer 14. The cap layer 16 is stacked on the perpendicular retaining layer 15A. The free layer 15 is called a "writing layer".

The perpendicular retaining layer 15A may retain a magnetization direction to a magnetization-easy axis. A direction parallel with the magnetization-easy axis may be referred to as a "perpendicular direction." A surface perpendicular to the magnetization-easy axis may be referred to as an "in-plane".

In the perpendicular retaining layer 15A, a magnetic anisotrophy changes from perpendicularity to the in-plane. For example, the perpendicular retaining layer 15A may be ferromagnetic having a critical temperature at which magnetic susceptibility is "0". The perpendicular retaining layer 15A may use, for example, RE-TM (Rare Earth-Transition Metal) alloy as a main component. In one embodiment, the perpendicular retaining layer 15A uses $Gd_{32-x}Fe_{68}Co_x$ (at %) as a main component. The expression "$Gd_{32-x}Fe_{68}Co_x$" means that since Co is included by x (at %), Gd and Fe are respectively included by 32−x (at %) and 68 (at %). For example, x may be 10 and the perpendicular retaining layer 15A may be a layer that uses $Gd_{22}Fe_{68}Co_{10}$ as a main component.

In one example case, the thickness of the perpendicular retaining layer 15A may be not less than 5 nm and not more than 10 nm. This thickness may be in a different range in another embodiment. A change in magnetic anisotrophy due to a temperature variation in the perpendicular retaining layer 15A will be more fully described below.

The high-polarization magnetic layer 15B has high spin polarizability. For example, the high-polarization magnetic layer 15B may use the Heusler alloy film having a L21 structure or a B2 structure as a main component. The high-polarization magnetic layer 15B may use the Co-based Heusler alloy as a main component. For example, the Co-based full-Heusler alloy may be CoFeB, $Co_2FeMnSi$, $Co_2FeSi$, $Co_2MnSi$, $Co_2FeAl$, or $Co_2CrAl$.

The non-magnetic layer 15C is formed of non-magnetic material. For example, the non-magnetic layer 15C may be a layer including Ta, Pt, Pd, or W as a main component. The non-magnetic layer 15C is stacked between the perpendicular retaining layer 15A and the high-polarization magnetic layer 15B, and controls an assist relationship between the perpendicular retaining layer 15A and the high-polarization magnetic layer 15B.

In one embodiment, to prevent in-plane magnetism from affecting (or hindering) switching when perpendicular magnetism of the high-polarization magnetic layer 15B is switched, the magnetization direction of the perpendicular retaining layer 15A may be the same as a magnetization direction of the high-polarization magnetic layer 15B after switching.

Accordingly, the thickness of the non-magnetic layer 15C may be determined to the extent that the perpendicular retaining layer 15A and the high-polarization magnetic layer 15B are magnetically coupled. For example, the thickness of the non-magnetic layer 15C may not be more than 1 nm. This thickness may be in a different range in another embodiment.

The cap layer 16 is a stabilization layer formed on the free layer 15. The cap layer may include, for example, Ru and Ta.

The magnetic tunnel junction element of the present embodiment may be included in the embodiments of the magnetoresistive memory device described herein.

Figure 12:
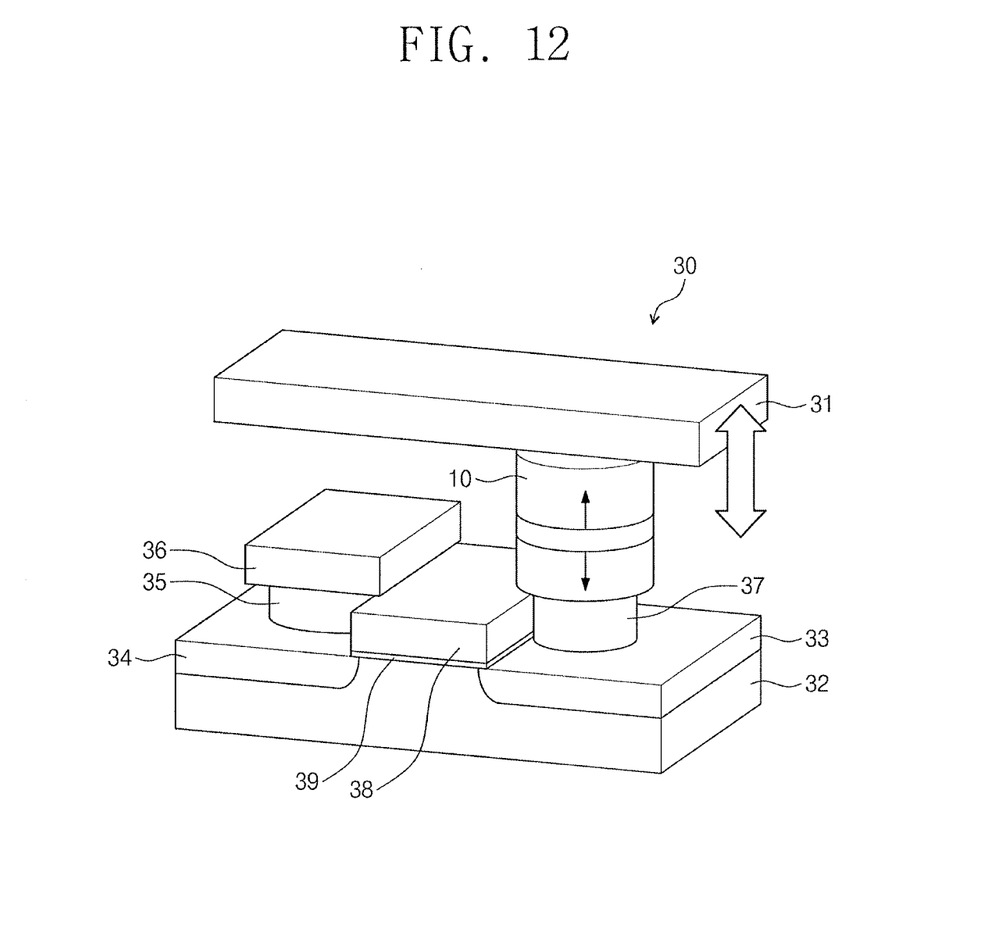
FIG. 12 illustrates another embodiment of a magnetoresistive memory device.

FIG. 12 illustrates a main portion of an embodiment of a magnetoresistive random access memory (MRAM) device. In FIG. 12, the MRAM device includes a memory cell 30, a bit line 31, contact plugs 35 and 37, and a word line 38.

The memory cell 30 includes a semiconductor substrate 32, diffusion areas 33 and 34, a source line 36, a gate insulating layer 39, and a magnetic tunnel junction element 10. The magnetic tunnel junction element 10 may correspond to any of the embodiments of the magnetic tunnel junction element 10 described herein.

The MRAM device includes a plurality of memory cells 30 arranged in a matrix and connected to each other through a plurality of bit lines 31 and a plurality of word lines 38. The MRAM device performs write processing of data by using a spin torque injection manner.

The diffusion areas 33 and 34 are formed in/on a surface of the semiconductor substrate 32. The diffusion area 33 is spaced apart from the diffusion area 34 by a predetermined distance. The diffusion area 33 functions as a drain area, and the diffusion area 34 functions as a source area. The diffusion area 33 is connected to the magnetic tunnel junction element 10 through the contact plug 37.

The bit line 31 is over the semiconductor substrate 32 and is connected to the magnetic tunnel junction element 10. The bit line 31 is connected to a write circuit and a read circuit.

The diffusion area 34 is connected to the source line 36 through the contact plug 35. The source line 36 is connected to the write circuit and the read circuit.

The word line 38 is disposed on the semiconductor substrate 32 through the gate insulating layer 39, in order to be adjacent to the diffusion area 33 and the diffusion area 34. The word line 38 and the gate insulating layer 39 function as a selection transistor. When the word line 38 is activated by a current supplied from a circuit, the word line 38 turns on as the selection transistor.

In the MRAM device, as a voltage is applied to the magnetic tunnel junction element 10 using the bit line 31 and the diffusion area 33 as electrodes, spin torques of electrons (which are arranged in a specific direction based on application of the voltage) change a magnetization direction of a ferromagnetic layer. As a current direction is switched, a value of data stored in the MRAM device may be changed.

Memory cells have been described in one or more embodiments as being one-dimensional. However, the memory cells may be arranged in two-dimension or more in another embodiment. In this case, addressing associated with memory cells may be implemented through an addressing circuit of a matrix form.

Also, an example in which a temperature sensor is included is described in the above embodiments. However, when a memory is installed in an environment in which device temperature is constant or in a constant-temperature device, a temperature sensor and a control configuration associated with a temperature may not be included.

Also, a method for increasing a temperature by a circuit operation or a method for increasing a temperature through a heater circuit or the like may be used instead of a method for increasing a device temperature in the above-described embodiments.

Also, a characteristic of a temperature detection circuit may be adjusted, for example, by a fuse, a nonvolatile cell, or a command. Also, a temperature detection signal may not be limited to an analog signal having positive temperature dependency and may have any other output form. Also, for example, an information signal associated with an optimum or predetermined current and a signal for adjusting a current may be implemented by a current mirror circuit or another type of circuit. In one embodiment, a digital signal obtained by quantizing a current setting value may be used.

Also, a memory according to one or more embodiments may not affect reading and writing performance while being used by a user after shipment. Thus, the memory may be appropriate to replace an eSRAM or the like for high-speed random access applications.

A magnetoresistive device (e.g., MRAM) includes a current control circuit that changes a switching write current value for rewriting data and a sense current for reading data by a peripheral temperature. Accordingly, the magnetoresistive device may operate at low-power and may have high-reliability characteristics, and thus may be suitable for use in a wide range of operation temperatures, e.g., 40° C. to +125° C.

In accordance with one embodiment, an apparatus includes an interface and a controller to output at least one signal through the interface to perform at least one of a first operation and a second operation. The interface may be a software or hardware interface. Examples of a hardware interface includes terminals, leads, wires, ports, signal lines, or structuring for carrying electrical signals. These features may correspond, for example, to one or more of the lines in the drawings or another line.

The first operation corresponds to controlling a write current value of a memory cell based on a maximum value. The second operation corresponds to controlling a read current value of the memory cell based on a minimum value. The memory cell includes a magnetic tunnel junction element of a magnetoresistive memory device. The maximum value and the minimum value are based on a current value writable in units of the memory cell. The features of the present embodiment may correspond, for example, to those in the aforementioned embodiments.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The control units, controllers, comparison units, determination units, selectors, and other signal generating and signal processing features of the embodiments disclosed herein may be implemented in logic which, for example, may include hardware, software, or both. When implemented at least partially in hardware, the control units, controllers, comparison units, determination units, selectors, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the control units, controllers, comparison units, determination units, selectors, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a magnetoresistive memory device may be provided which reduces the probability of a write fail and/or other abnormal write operations from occurring. The terms magnetoresistive memory device and MRAM may be used interchangeably herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A magnetoresistive memory device, comprising:
   a plurality of memory cells, each memory cell including a magnetic tunnel junction element;
   a detector to detect a maximum value and a minimum value among a plurality of writing current values of the plurality of memory cells, each writing current value of each memory cell for successfully writing the magnetic tunnel junction element of each memory cell;
   a current value storage area to store the maximum value and the minimum value detected by the detector; and
   a current controller to perform writing operations on the plurality of memory cells based on the maximum value and reading operations on the plurality of memory cells based on the minimum value.

2. The magnetoresistive memory device as claimed in claim 1, wherein the current controller applies currents corresponding to the maximum value or more to the plurality of memory cells for the writing operations thereof.

3. The magnetoresistive memory device as claimed in claim 1, wherein the current controller applies currents corresponding to the minimum value or less to the plurality of memory cells for the reading operations thereof.

4. The magnetoresistive memory device as claimed in claim 1, wherein the memory cell includes:
   a free layer having a variable magnetization direction;
   a pinned layer to retain a magnetization direction in a predetermined direction; and
   an insulating layer between the free layer and the pinned layer, wherein the free layer includes a perpendicular retaining layer and a high-polarization magnetic layer.

5. The magnetoresistive memory device as claimed in claim 1, wherein each writing current value of each memory cell is a minimum current value for successfully writing the magnetic tunnel junction element of each memory cell.

6. The magnetoresistive memory device as claimed in claim 1, further comprising:
   a read and write circuit to write first information into the plurality of memory cells and read second information from the plurality of memory cells.

7. The magnetoresistive memory device as claimed in claim 6, wherein the detector detects the writing current values based on a signal from the read and write circuit.

8. The magnetoresistive memory device as claimed in claim 6, wherein each of the writing current values is determined by comparing the first information with the second information.

9. A magnetoresistive memory device, comprising:
   a memory cell including a magnetic tunnel junction element;
   a detector to detect a current value writable in units of the memory cell;
   a current value storage area to store at least one of a maximum value and a minimum value of the writable current value detected by the detector;
   a current controller to perform at least one control operation of an operation of controlling a write current value of the memory cell based on the maximum value and an operation of controlling a read current value of the memory cell based on the minimum value; and
   a temperature sensor to measure a temperature of the magnetoresistive memory device, wherein the current value storage area is to store a correspondence relationship between the temperature measured by the temperature sensor and at least one of the maximum value and the minimum value, and wherein
   the current controller is to perform the at least one control operation of the operation of controlling the write current value of the memory cell based on the maximum value corresponding to a temperature upon writing and the operation of controlling the read current value of the memory cell based on the minimum value corresponding to the temperature upon writing.

10. A magnetoresistive memory device, comprising:
   a memory cell including a magnetic tunnel junction element;
   a detector to detect a current value writable in units of the memory cell;
   a current value storage area to store at least one of a maximum value and a minimum value of the writable current value detected by the detector;
   a current controller to perform at least one control operation of an operation of controlling a write current value of the memory cell based on the maximum value and an operation of controlling a read current value of the memory cell based on the minimum value, wherein
   the current value storage area is to store an address of a memory cell, at which at least one of the maximum value and the minimum value is detected, and is to update a record of the at least one of the maximum value and the minimum value based on the write current value of the memory cell of the address.

* * * * *